United States Patent
Cheaytani et al.

(10) Patent No.: US 10,868,484 B2
(45) Date of Patent: Dec. 15, 2020

(54) ELECTRICAL DEFECT DETECTION IN A GENERATOR

(71) Applicant: ELECTRICITE DE FRANCE, Paris (FR)

(72) Inventors: Jalal Cheaytani, Paris (FR); Jeremy Langlet, Ville d'Avray (FR); Valentin Costan, Bourg la Reine (FR)

(73) Assignee: ELECTRICITE DE FRANCE, Paris (FR)

( * ) Notice: Subject to any disclaimer, the term of this patent is extended or adjusted under 35 U.S.C. 154(b) by 0 days.

(21) Appl. No.: 16/679,559

(22) Filed: Nov. 11, 2019

(65) Prior Publication Data

US 2020/0153371 A1    May 14, 2020

(30) Foreign Application Priority Data

Nov. 12, 2018  (FR) ...................................... 18 71481

(51) Int. Cl.
*H02P 9/10*     (2006.01)
*H02P 9/00*     (2006.01)
*H02P 101/15*   (2016.01)

(52) U.S. Cl.
CPC .............. *H02P 9/105* (2013.01); *H02P 9/007* (2013.01); *H02P 2101/15* (2015.01)

(58) Field of Classification Search
CPC ....... H02P 9/007; H02P 9/105; H02P 2101/15
USPC ............................... 322/20; 324/545, 765.01
See application file for complete search history.

(56) References Cited

U.S. PATENT DOCUMENTS

| | | | | |
|---|---|---|---|---|
| 6,459,276 B1 * | 10/2002 | Matthews | ............... | G01R 31/34 324/545 |
| 6,774,664 B2 * | 8/2004 | Godbersen | ............. | G01R 31/34 324/545 |
| 7,382,138 B1 * | 6/2008 | Umans | ................... | G01R 31/34 324/545 |

(Continued)

FOREIGN PATENT DOCUMENTS

| | | |
|---|---|---|
| CN | 106597276 A | 4/2017 |
| CN | 106841900 A | 6/2017 |
| PL | 220252 B1 | 9/2015 |

OTHER PUBLICATIONS

Search Report issued in related application FR 18 71481, dated Sep. 11, 2019, 7 pages.

*Primary Examiner* — Pedro J Cuevas
(74) *Attorney, Agent, or Firm* — Faegre Drinker Biddle & Reath LLP

(57) ABSTRACT

A method for monitoring and detecting defects in a doubly-fed asynchronous machine including a stator and a rotor, said method implemented by computer means. The method comprises: a. receiving a current and a voltage measurement of the stator, and a measurement of relative rotation speed between the stator and the rotor; b. deducing a stat or power as a function of time; c. performing a harmonic analysis on the resulting stator power including applying a wavelet transform to the stator power; d. comparing the resulting harmonic representation to a reference harmonic representation, where said reference harmonic representation is selected as a function of the rotation speed measurement, so as to detect possible defects in said machine as a function of possible differences identified by the comparison.

9 Claims, 3 Drawing Sheets

(56) References Cited

U.S. PATENT DOCUMENTS

| | | | |
|---|---|---|---|
| 7,598,751 B2 * | 10/2009 | Collins, Jr. | G01R 19/2513 324/649 |
| 8,405,339 B2 * | 3/2013 | Zhang | G01R 31/343 318/490 |
| 8,878,373 B2 * | 11/2014 | Thoresen | F03D 9/255 290/1 R |
| 9,261,562 B2 * | 2/2016 | Lee | G01R 31/343 |
| 9,541,606 B2 * | 1/2017 | Neti | G01R 31/343 |
| 9,618,583 B2 * | 4/2017 | Liu | G01R 31/346 |
| 10,267,860 B2 * | 4/2019 | Athikessavan | G01R 31/343 |
| 10,353,005 B2 * | 7/2019 | Williams | H02P 29/024 |
| 10,403,116 B2 * | 9/2019 | Neti | G01R 31/343 |
| 10,429,419 B2 * | 10/2019 | Choi | G01R 31/343 |
| 10,495,693 B2 * | 12/2019 | Unnikrishnan | F03D 17/00 |
| 10,514,428 B2 * | 12/2019 | Williams | G01R 33/0017 |
| 10,686,394 B1 * | 6/2020 | Eldeeb | H02P 21/13 |
| 10,698,031 B2 * | 6/2020 | Smiley | G01R 31/343 |
| 10,739,405 B2 * | 8/2020 | Desabhatla | H02P 29/0241 |
| 2005/0200378 A1 * | 9/2005 | Hobelsberger | G01R 31/1227 324/765.01 |
| 2008/0144927 A1 * | 6/2008 | Hashimoto | G01N 29/045 382/156 |
| 2009/0273336 A1 * | 11/2009 | Wolfe | G01R 31/42 324/76.11 |
| 2010/0026312 A1 * | 2/2010 | Buxkemper | G01R 31/62 324/547 |
| 2010/0060289 A1 * | 3/2010 | Wiedenbrug | G01R 31/66 324/511 |
| 2011/0191034 A1 * | 8/2011 | Lee | G01R 31/343 702/35 |
| 2013/0062889 A1 * | 3/2013 | Thoresen | H02P 27/16 290/1 R |
| 2014/0049285 A1 * | 2/2014 | Rodriguez | G01H 1/003 324/765.01 |
| 2014/0167810 A1 * | 6/2014 | Neti | G01R 31/34 324/765.01 |
| 2016/0033580 A1 * | 2/2016 | Qiao | F03D 7/0296 324/765.01 |
| 2020/0134939 A1 * | 4/2020 | Schell | G07C 5/0841 |
| 2020/0134942 A1 * | 4/2020 | Root | B60C 23/127 |
| 2020/0205739 A1 * | 7/2020 | Garrett | A61B 5/7221 |

* cited by examiner

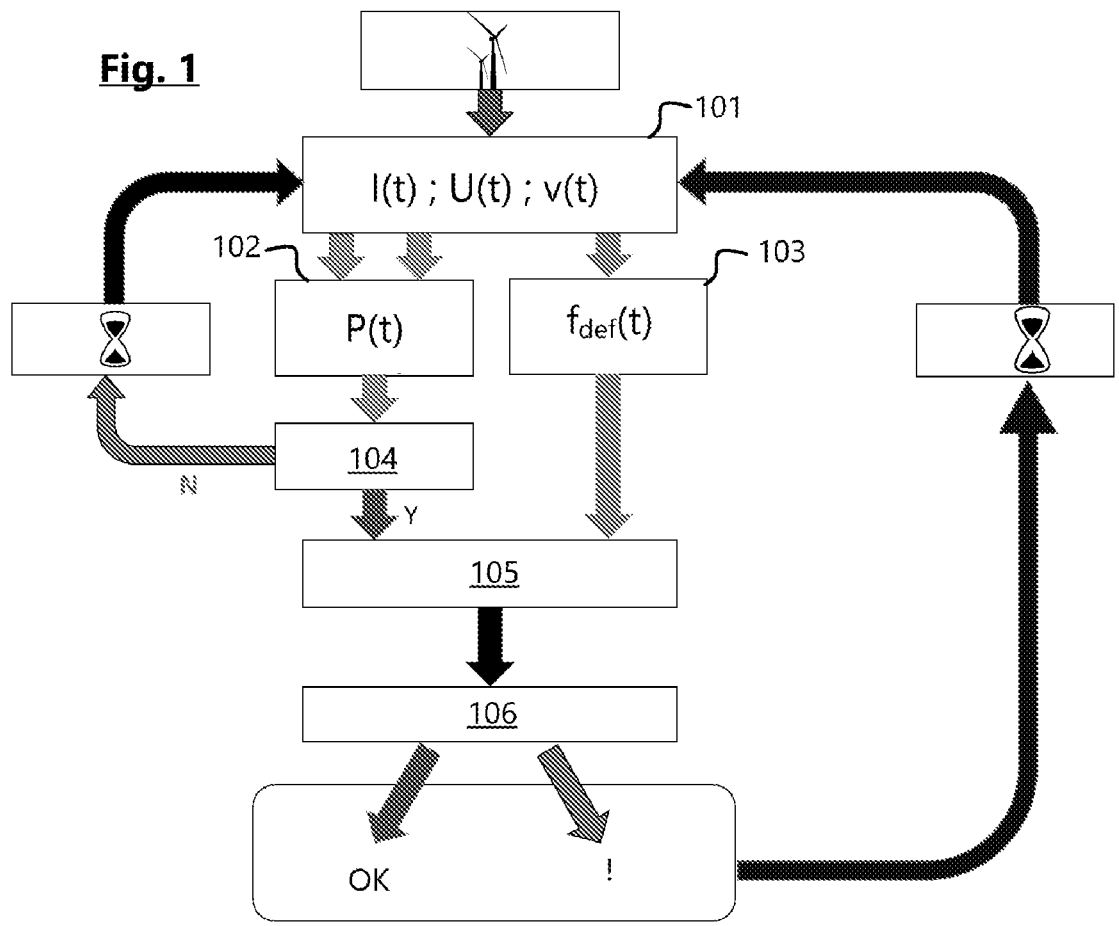

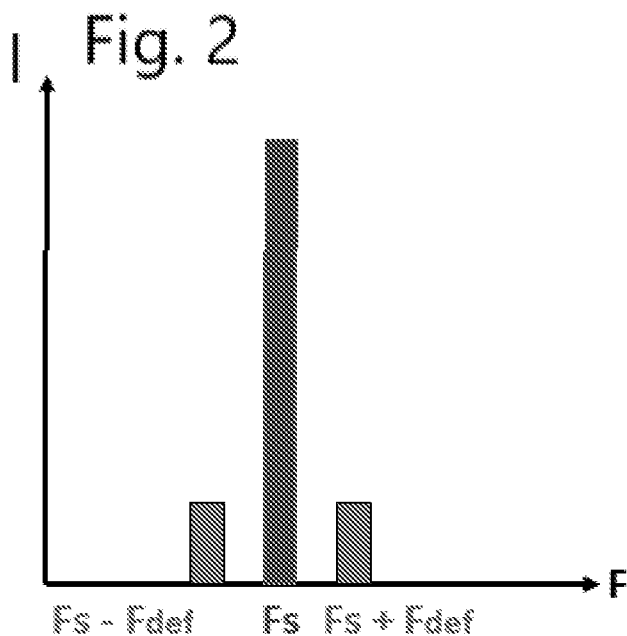
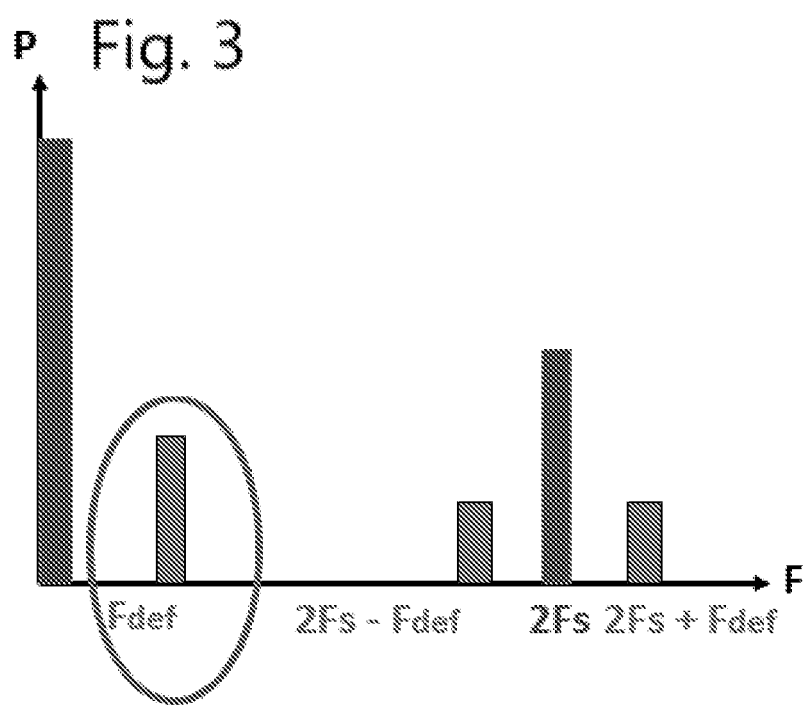

ELECTRICAL DEFECT DETECTION IN A GENERATOR

CROSS-REFERENCE TO RELATED APPLICATION

This application claims priority benefit under 35 U.S.C. § 119(d) from French Patent Application No. 1871481, filed Nov. 12, 2018, the disclosure of which is incorporated by reference herein in its entirety.

FIELD

The invention is from the field of rotating electrical machines, typically generators, and in particular doubly-fed induction generators, or "DFIG".

BACKGROUND

It is known to monitor DFIG by means of electrical measurements, in order to detect possible defects. Since the DFIG is an essential component in wind turbines, such monitoring is specifically applicable in the context of preventive monitoring and maintenance of wind turbines. Low cost and nonintrusive electrical measurements can be done remotely, substantially in real time, and automatically. Thus, with such monitoring preventive operations can be planned when minor defects are detected early, before such defects worsen and lead to major failures that are costly to repair.

Among the known monitoring methods, many must be implemented when the DFIG are shut down, which implies interrupting their normal operation and therefore the production of energy in the case of wind turbines.

In the context of wind turbines, other known methods are based on vibrational analyses. The vibrational analyses are done during operation (without interrupting energy production) and are used to detect many anomalies in the kinematic chain of the wind turbines. Just the same, vibrational analyses are unreliable for detecting anomalies resulting from defects in the DFIG. When an anomaly whose cause is within the DFIG is detected by vibrational analysis, it often turns out that the defect is severe and that emergency steps must be taken. A light maintenance operation is not, or is no longer, sufficient.

Finally, there are defect monitoring and detection methods based on electrical measurements. Said methods generally involve a harmonic analysis of measured electrical currents by Fourier transforms. Then, frequencies characteristic of each known defect type are sought. Because of its nature, this prevents fine monitoring of variations over time, because the measurements are averaged over time. Further, such methods are only effective at constant frequency, which is not in practice the case in a DFIG. The frequency vibrations are particularly significant in wind turbine DFIG because the frequencies depend on the wind speed which is itself variable over time. Finally, the applicant observed that the characteristic frequencies of the most common defects are close, in frequency, to the fundamental frequency of the DFIG, to the point of being difficult to distinguish from each other. This makes such monitoring methods even more complex and unreliable, at least for some DFIG defects. There are high risks of not detecting a real anomaly and of identifying a fictitious anomaly ("false positive").

SUMMARY

The invention serves to improve the situation.

A method is proposed for monitoring and detecting defects in a doubly-fed asynchronous machine including a stator and a rotor. The method is implemented by computer means. The method comprises:

a. receiving, as input and as a function of time, a current measurement and a voltage measurement of at least one phase of the stator, and a measurement of relative rotation speed between the stator and the rotor;

b. deducing a stator power as a function of time from received current and voltage measurements;

c. performing a harmonic analysis on the resulting stator power, where said harmonic analysis includes applying a wavelet transform to the resulting stator power, such that a harmonic representation of the stator power as a function of frequency results;

d. comparing the resulting harmonic representation to a reference harmonic representation, where said reference harmonic representation is selected as a function of the rotation speed measurement, so as to detect possible defects in said machine as a function of possible differences identified by the comparison. Then, an alarm signal can be generated and sent such that a maintenance or repair operation can be planned.

According to another aspect, a system for monitoring at least one doubly-fed asynchronous machine is proposed comprising at least one voltage sensor, one current sensor, one rotation speed sensor and one calculation module, where each sensor is arranged for sending measurement data to the at least one calculation module and said calculation module is arranged for implementing a method such as described in the present. According to another aspect, a computer program is proposed comprising instructions for implementing all or part of a method such as defined in the present when this program is executed by a processor. According to another aspect of the invention, a computer-readable nonvolatile recording medium is proposed on which such a program is recorded.

The characteristics disclosed in the following paragraphs may, optionally, be implemented. They can be implemented independently of each other or in combination:

In the method, the reference harmonic representation can be selected depending, further, on the reactive power of the machine and a stator voltage.

In the method, the measurements can be made for lengths included between 1 and 5 seconds and/or with a sampling frequency included between 5 and 20 kHz.

The method may further comprise, prior to the harmonic analysis of the stator power, an operation of determining at least one frequency of a known defect as a function of the rotation speed, where the harmonic analysis is then implemented for each defect frequency determined.

The method may further comprise, after deducing the stator power and prior to harmonic analysis of the stator power, an operation of verifying stability of the powers during the measurement time.

The method can be repeated such that real-time monitoring of the doubly-fed asynchronous machine is performed.

BRIEF DESCRIPTION OF THE DRAWINGS

Other features, details and advantages of the invention will be seen upon reading the following detailed description, and analyzing the attached drawings, in which:

FIG. 1 shows a method according to an embodiment of the invention;

FIG. 2 shows a harmonic representation of the electric currents when a defect is present;

FIG. 3 shows a harmonic representation of the electric powers resulting from an embodiment of the invention when a defect is present;

DETAILED DESCRIPTION

Figure 4:
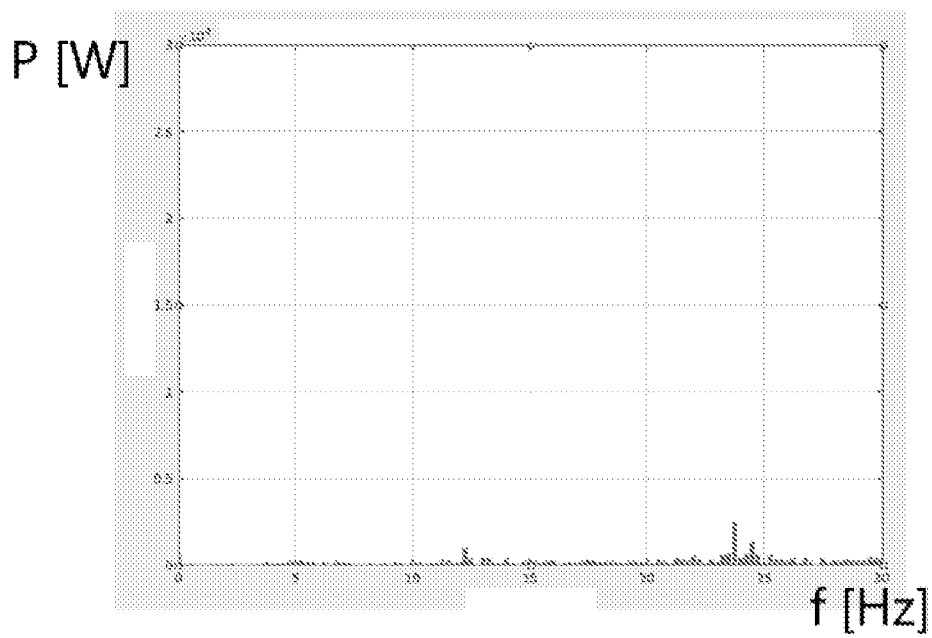
FIG. 4 shows a harmonic representation of the total stator power of a problem-free generator.

The drawings and the following description contain, for the most part, elements of specific character. They could therefore not only serve to make the present invention better understood, but also contribute to the definition thereof, as applicable.

Reference is now made the FIG. 1. A method is for monitoring and detecting defects in a doubly-fed asynchronous machine (DFIG) is shown in it. The DFIG includes a stator and a rotor. The method is implemented by computer means. The method comprises the following operations:

a. receiving 101, as input and as a function of time, a current measurement I(t) and a voltage measurement U(t) of the at least one phase of the stator, and a measurement of relative rotation speed v(t) between the stator and the rotor;

b. deducing 102 a stator power P(t) as a function of time from received current I(t) and voltage U(t) measurements;

c. performing 105 a harmonic analysis on the resulting stator power P(t), where said harmonic analysis includes applying a wavelet transform to the resulting stator power P(t), such that a harmonic representation P(t,f) of the stator power as a function of frequency results;

d. comparing (106) the resulting harmonic representation to a reference harmonic representation, where said reference harmonic representation is selected as a function of the rotation speed v(t) measurement, so as to detect possible defects in said machine as a function of possible differences identified by the comparison.

In the example described here, each DFIG belongs to a wind turbine. Here, the DFIG operate with three-phase current. The current and voltage measurements (operation a) are done separately on each phase. Thus, during the later determination of the power (operation b), the deduced power can be the sum of the three powers over the three phases. In case of an anomaly, the sum over the three phases serves to amplify the differences from a reference DFIG considered as without defect. As a variant, the analysis can be done on a single phase or only on some of them. In the following, and out of concern for simplification, reference is made to only one phase.

Measurements are preferably done on the stator. The installation of sensors on the stator is easier than on the rotor. Further, stator side electrical signals more accurately reproduce the state of the DFIG. In fact, currents circulating in the stator windings depend on the electrical supply and the winding impedance, but also currents induced by the magnetic field created by the rotor. Thus, reading the voltages and currents on the stator windings (instead of on the rotor windings) then serves to detect all the defects, whether they come from the stator or the rotor.

In the examples described, the measurements are made over several seconds, for example between 1 and 5 seconds. The sampling frequency is several kilohertz, for example between 5 and 20 kHz.

Deducing a stator power P(t) as a function of time (operation b) can take various forms. It can result from a simple product of the current by the voltage (P(t)=U(t)·I(t)) for a single phase or else, for example, from the sum of the products of voltage by current for each phase (P(t)=U$_1$(t)·I$_1$(t)+U$_2$(t)·I$_2$(t)+U$_3$(t)·I$_3$(t)), where the index number identifies the phases relative to each other.

Then, a harmonic analysis of the stator power (P(t)) is done. To understand what the harmonic analysis consists of, it is important to understand that, in the case of an ideal machine (theoretical DFIG without defect; index "OK"), the instantaneous power can be expressed according to the following equation:

$$P_{A\_OK}(t) = U_{AB}(t) \cdot I_{A\_OK}(t) = \qquad [\text{Math. 1}]$$
$$\frac{V_m \cdot I_m}{2}\cos(2(2\pi f_s \cdot t) - \varphi) + \frac{V_m \cdot I_m}{2}\cos(\varphi) \text{ with}$$

$$U_{AB}(t) = V_m \cdot \cos(2\pi f_s \cdot t). \qquad [\text{Math. 2}]$$

$$I_{A\_OK}(t) = I_m \cdot \cos(2\pi f_s \cdot t - \varphi) \qquad [\text{Math. 3}]$$

$f_s$ representing the electric supply frequency at the stator and φ representing the phase offset angle between the current and the voltage.

From [Math. 1], it can be observed that, when the voltage and current comprise just one single frequency $f_s$, the instantaneous power is broken down into the sum of the continuous component and an alternating component with frequency $2 \cdot f_s$.

When a defect is present, the time expression of the stator current can be defined based on the general equation for amplitude modulation y(t)=(A+n(t))·c(t), where (A+n(t)) is the modulating function, and c(t) is the modulated function. In this case, the following is the expression for the current at the stator when a defect (index "def") is present:

$$I_{A\_def}(t) = I_{A\_OK}(t) \cdot [1 + M \cdot \cos(2\pi f_{def} \cdot t)] \qquad [\text{Math. 4}]$$

$$I_{A\_def}(t) = I_{A\_OK}(t) + \frac{M \cdot I_m}{2}\cos(2\pi(f_s - f_{def}) \cdot t - \varphi) + \qquad [\text{Math. 5}]$$
$$\frac{M \cdot I_m}{2}\cos(2\pi(f_s + f_{def}) \cdot t - \varphi)$$

The equation [Math. 5] brings out the origin of the two lines characteristic of the defect: ($f_s-f_{def}$) and ($f_s+f_{def}$) and which are close to the fundamental frequency $f_s$. Further, the expression for the electrical power when a defect is present can be:

$$P_{A\_def}(t) = P_{A\_OK}(t) + \frac{M \cdot V_m \cdot I_m}{4}\cos(2\pi(2f_s - f_{def}) \cdot t - \varphi) + \qquad [\text{Math. 6}]$$
$$\frac{M \cdot V_m \cdot I_m}{4}\cos(2\pi(2f_s + f_{def}) \cdot t - \varphi) +$$
$$\frac{M \cdot V_m \cdot I_m}{2} \cdot \cos(\varphi) \cdot \cos(f_{def} \cdot t)$$

This expression for the power shows the presence of lines around the frequency $2 \cdot f_s$: ($2f_s-f_{def}$) and ($2f_s+f_{def}$). This expression further shows the presence of the isolated frequency of the defect ($f_{def}$). The characteristic frequency of the defect in the harmonic representation of the electrical power then makes it possible to next diagnose and detect defects in the generator. For example, for a rotor defect in DFIG, the expression for the frequency of the defect is ($2 \cdot g \cdot f_s$), where "g" is the sliding of the machine which accounts for the rotation speed difference between the rotor and the stator field. Thus, the defect frequencies in the DFIG depend on the rotation speed of the generator.

FIGS. 2 and 3 show a comparison between the harmonic representation of the electrical currents ([FIG. 2]) and powers ([FIG. 3]) when a defect is present.

In the example described here, an operation 103 is implemented. The operation 103 comprises determining the at least one frequency $f_{def}(t)$ of a known defect as a function of the rotation speed v(t). By knowing each known-defect frequency in advance, the harmonic analysis for each of them from actual measurements can then be made easier.

In the example described here, an optional operation 104 is implemented. The operation 104 is implemented after calculation of the powers and before implementation of the harmonic analysis. During the operation 104, the powers calculated as a function of time undergo a stability test. In other words, it is verified that the powers calculated from the voltage and current measurements are stable during the measurement time (generally a few seconds). In that way it is verified that the DFIG is not in a transitional state, typically start up or shut down. The remainder of the method (harmonic analysis) is implemented only if the preestablished stability criteria are met. Otherwise, a time delay is implemented, for example between 1 and 10 minutes, and then the method is restarted, and new measurements are done. The selection of the stability criteria depends on the dimensions of the DFIG. For example, the stability criterion may consist of confirming that the power remains over a threshold value throughout the measurement.

The resulting harmonic analysis of the stator power P(t) includes a wavelet transformation. In fact, the defects to be detected in the DFIG are characterized in the stator electrical power by frequency lines whose frequency depends on the rotation speed of the machine which is itself variable over time. Thus, unlike a Fourier transform, a wavelet transform can take into account the variation of the frequencies and amplitudes of the defect lines throughout the length of the signal. Consequently, the time window (measurement length) can be very brief, in particular shorter than the measurement length necessary when analyses based on Fourier transforms are used. A representation as a function of time and the frequency of the signal can be obtained with wavelet analysis. The time-frequency representation brings two reciprocal steps into play: analysis and synthesis. To do the analysis of a signal, it is broken down into a sum of simple and universal constituents called elementary functions. For Fourier analysis, the usual elementary functions are sinusoidal functions. The sinusoidal functions depend on a single parameter: the frequency. In the case of wavelet analysis, the elementary functions involve two parameters "a" and "b", where "a" is connected with the frequency and "b" with time.

In the following mathematical expressions, the coefficients $C_{a,b}$ ([Math. 7]) correspond to each elementary function $\psi_{a,b}$ ([Math. 9]) used to decompose an arbitrary signal. The coefficients $C_{a,b}$ are representative of the time and frequency properties of the signal. The coefficients are calculated by taking the continuous sum of the product $P_{A\_def}(t)$ times the family of elementary functions $\psi_{a,b}(t)$. The family of wavelets $\psi_{a,b}$ is generated from a single wavelet $\psi$ called mother or analyzing wavelet ([Math. 8]). The $\psi_{a,b}$ are built by a translation in time and by dilation or contraction in time of $\psi_{a,b}$.

$$C_{a,b} = \int_{-\infty}^{+\infty} P_{A\_def}(t) \cdot \psi_{a,b}(t) \cdot dt \qquad \text{[Math. 7]}$$

$$\psi(t) = \cos(5t) \cdot e^{-\frac{t^2}{2}} \qquad \text{[Math. 8]}$$

(Morlet Mother Wavelet)

$$\psi_{a,b}(t) = \frac{1}{\sqrt{a}} \cdot \psi\left(\frac{t-b}{a}\right) \qquad \text{[Math. 9]}$$

The identification of the frequency of interest in the coefficients $C_{a,b}$ is done by calculating the value of the parameter "a", also called "parameter of interest," in [Math. 10]. The representation over time of the parameter of interest "a" is done by taking the set of values of "b". The parameter of interest "a" depends on the mother wavelet used for the wavelet analysis, in particular the central frequency thereof. The central frequency of the Morlet mother wavelet is equal to 0.8125.

$$a = \frac{0.8125}{f_{int} * \Delta t} \qquad \text{[Math. 10]}$$

where $\Delta t$ is the time step of the measurements and $f_{int}$ is the frequency of interest.

The wavelet analysis of the stator electric power starts with the calculation of the parameter of interest "a" as a function of the frequencies of defects sought ([Math. 10]). The results calculated by wavelet analysis depend on time and this parameter of interest "a". Thus, for each defect frequency ($f_{def}(t)$ resulting for operation 103) the absolute value of the result of the analysis is a curve which varies as a function of time. The defect coefficient ("$Coef_{def}$") sought for one given defect frequency is calculated by taking the maximum of the square of the curve over the entire length of the signal and dividing it by the nominal power the generator ($P_n$) in order to make it dimensionless, as expressed in [Math. 11] below.

$$Coef_{def} = \frac{\max(|a(f_{def})|^2)}{P_n} \qquad \text{[Math. 11]}$$

Finally, in operation 106, the resulting harmonic representation is compared to a reference harmonic representation. From one or more reference harmonic representations for machine(s) with defects, a theoretical defect coefficient, forming a threshold, is predetermined. The resulting defect coefficient for the monitored machine is then compared to said predetermined threshold value.

Preferably, the reference harmonic representation is selected not only as a function of the rotation speed, but also further as a function of a reactive power of the DFIG and a stator voltage. In fact, the harmonic representation of the stator power (especially the frequencies connected with the defects) also depends on the reactive power and the stator voltage. It is therefore particularly advantageous to consider these items; the risks of detection error are reduced. In the opposite case, possibility of false alarms and/or missing defect detection can occur, reducing the reliability of the monitoring.

Healthy DFIG type generators and those with defects can be modeled by means of finite element models and/or circuit type models (based on equivalent circuits) in order to determine the thresholds. With the finite element models, defects of the type of short-circuit between coils can be modeled more finely, whereas the circuit models are faster and use less calculation time. Tests in real situations on healthy machines and others with known defects have also served to determine thresholds according to each type of DFIG.

In the example shown in [FIG. 1], the method described above is iterative. After a time delay, the method is reinitialized with new measurements. In other words, the method can be implemented substantially continuously such that real-time monitoring is implemented.

Figure 5:
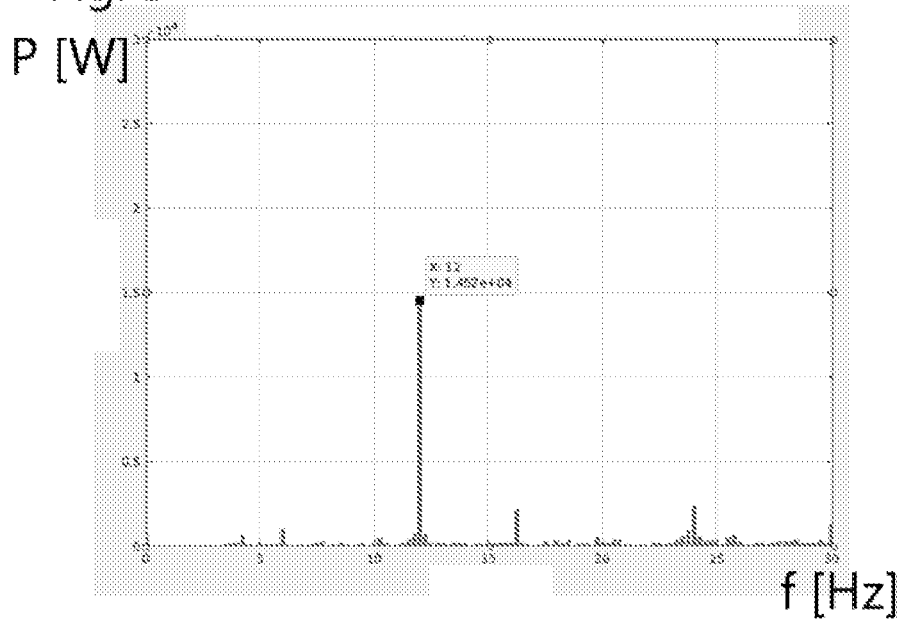
FIG. 5 shows a harmonic representation of this total stator power from the same generator as in FIG. 4 but with a defect.

[FIG. 4] and [FIG. 5] show examples of results (frequency representations) obtained by a single DFIG model of 2 MW nominal power, respectively without defect ([FIG. 4]) and with a rotor winding defect ([FIG. 5]), for a rotation speed of 1680 RPM and the default frequency of 12 Hz. With the wavelet transformations, a time signal with one or more electrical periods can be analyzed in order to transfer it into a frequency representation. The frequency representation, or representation in harmonics, is preferred because it serves to overcome the origin of time and allows a better classification of the defect for which the signatures represented by one or more frequency lines. As for the amplitudes of these lines, they are used as defect detection parameters and compared to the thresholds for defects in the generators.

Based on tests done by the applicant, many types of defects can be detected with the use of such methods, and in particular electrical defects of the windings in the stator and/or the rotor, short-circuits, electrical supply defects to the rotor, carbon and slip ring electric contact defects, mechanical defects like eccentricities and rolling defects.

The invention was described above in the form of a method. The method may be implemented by computer means. Thus, the invention can take the form of the DFIG equipped with voltage, current and rotation speed sensors. Said sensors are connected to a calculation module including at least one processor arranged so as to implement at least in part the process described above. The calculation module can be installed on the DFIG and be considered as a component thereof, or else be remoted. Similarly, a single calculation module can receive measurement data from a plurality of DFIG such that the implementation of the calculations and monitoring our centralized, for example for monitoring all or part of a wind turbine park. The invention can therefore take the form of a monitoring system comprising at least one calculation module and the corresponding sensors.

The invention can be applied in particular in the field of terrestrial or maritime when turbines for DFIG type generators, without being limited to that.

The invention is not limited to the examples of methods, systems, computer programs and recording media described above, solely as examples, but it encompasses all variants which could be conceived by the person skilled in the art within the scope of the protection sought.

The invention claimed is:

1. A method for monitoring and detecting defects in a doubly-fed asynchronous machine including a stator and a rotor, said method being implemented by computer means, where said method comprises:
   a. receiving, as input and as a function of time, a current measurement and a voltage measurement of at least one phase of the stator, and a measurement of relative rotation speed between the stator and the rotor;
   b. deducing a stator power as a function of time from received current and voltage measurements;
   c. performing a harmonic analysis on the resulting stator power, where said harmonic analysis includes applying a wavelet transform to the resulting stator power, such that a harmonic representation of the stator power as a function of frequency results;
   d. comparing the resulting harmonic representation to a reference harmonic representation, where said reference harmonic representation is selected as a function of the rotation speed measurement, so as to detect possible defects in said machine as a function of possible differences identified by the comparison.

2. The method according to claim 1 wherein the reference harmonic representation is selected depending, further, on the reactive power of the machine and a stator voltage.

3. The method according to claim 1 wherein the measurements are made for lengths included between 1 and 5 seconds and/or with a sampling frequency included between 5 and 20 kHz.

4. The method according to claim 1 further comprising, prior to the harmonic analysis of the stator power, an operation of determining at least one frequency of a known defect as a function of the rotation speed v(t), where the harmonic analysis is then implemented for each defect frequency determined.

5. The method according to claim 1 further comprising, after deducing the stator power and prior to harmonic analysis of the stator power, an operation of verifying stability of the powers during the measurement time.

6. The method according to claim 1, wherein the method can be repeated such that real-time monitoring of the doubly-fed asynchronous machine is performed.

7. A system for monitoring at least one doubly-fed asynchronous machine is proposed comprising at least one voltage sensor, one current sensor, one rotation speed sensor and one calculation module, where each sensor is arranged for sending measurement data to the at least one calculation module and said calculation module is arranged for implementing a method according to claim 1.

8. A computer program comprising instructions for implementing the method according to claim 1 when this program is executed by a processor.

9. A computer-readable nonvolatile recording medium on which such a program is recorded for implementing the method according to claim 1 when this program is executed by a processor.

* * * * *